(12) United States Patent
Kim et al.

(10) Patent No.: US 8,912,048 B2
(45) Date of Patent: Dec. 16, 2014

(54) METHOD OF FABRICATING SEMICONDUCTOR DEVICE INCLUDING A SUBSTRATE ATTACHED TO A CARRIER

(71) Applicant: Samsung Electronics Co., Ltd., Suwon-Si (KR)

(72) Inventors: Jong-Youn Kim, Seoul (KR); Ji-Hwang Kim, Bucheon-si (KR); Hae-Jung Yu, Seoul (KR); Cha-Jea Jo, Bucheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/803,662

(22) Filed: Mar. 14, 2013

(65) Prior Publication Data
US 2014/0213017 A1    Jul. 31, 2014

(30) Foreign Application Priority Data

Jan. 31, 2013  (KR) .................. 10-2013-0011347

(51) Int. Cl.
  *H01L 21/00*   (2006.01)
  *H01L 21/82*   (2006.01)
(52) U.S. Cl.
  CPC .................................... *H01L 21/82* (2013.01)
  USPC ............................ 438/113; 438/118; 438/460
(58) Field of Classification Search
  None
  See application file for complete search history.

(56) References Cited

U.S. PATENT DOCUMENTS

| | | | | |
|---|---|---|---|---|
| 7,060,531 | B2 * | 6/2006 | Arita | 438/114 |
| 7,696,014 | B2 * | 4/2010 | Kitahara et al. | 438/118 |
| 7,906,410 | B2 * | 3/2011 | Arita et al. | 438/462 |
| 2004/0121563 | A1 * | 6/2004 | Farnworth et al. | 438/465 |
| 2008/0190902 | A1 * | 8/2008 | Nakamura | 219/121.67 |
| 2009/0042366 | A1 * | 2/2009 | Grivna | 438/460 |
| 2012/0018854 | A1 * | 1/2012 | Kato et al. | 257/622 |
| 2012/0070939 | A1 | 3/2012 | Dunne et al. | |

FOREIGN PATENT DOCUMENTS

| | | |
|---|---|---|
| JP | 2004-095946 A | 3/2004 |
| JP | 2008-098428 A | 4/2008 |
| JP | 2009-071145 A | 4/2009 |
| JP | 2011-258625 A | 12/2011 |
| JP | 2012-028541 A | 2/2012 |
| KR | 2008-0114036 A | 12/2008 |
| KR | 10-0927778 A | 9/2009 |

* cited by examiner

*Primary Examiner* — Andres Munoz
(74) *Attorney, Agent, or Firm* — Harness, Dickey & Pierce, P.L.C.

(57) ABSTRACT

A method of fabricating a semiconductor device includes attaching a semiconductor substrate to a carrier using a carrier fixing layer, where the semiconductor substrate including a plurality of semiconductor chips. The method further includes forming gaps between adjacent ones of the chips. The gaps may be formed using one or more chemicals or light which act to remove portions of the semiconductor substrate to expose the carrier fixing layer. Additional portions of the carrier fixing layer are then removed to allow for removal of the chips from the carrier.

15 Claims, 6 Drawing Sheets

METHOD OF FABRICATING SEMICONDUCTOR DEVICE INCLUDING A SUBSTRATE ATTACHED TO A CARRIER

This application claims priority from Korean Patent Application No. 10-2013-0011347 filed on Jan. 31, 2013 in the Korean Intellectual Property Office, the disclosure of which is incorporated herein by reference in its entirety.

BACKGROUND

1. Field

The present disclosure relates to a method of fabricating a semiconductor device.

2. Description of the Related Art

The current trend in the electronics industry is to fabricate lighter, smaller, faster and higher-performance products with multiple functions at low cost. To meet this trend, multi-chip stacked packaged technology or system in package technology has been developed. The multi-chip stacked package technology or the system in package technology uses a through via to form electrical connections and/or other features of the device. In through-via technology, the underlying substrate handling has become a focus and a possible source of creating defects. To handle the substrate, some approaches use a carrier temporarily attached to the thin substrate. However, these approaches have proven to have drawbacks.

SUMMARY

In accordance with one or more embodiments, a method of fabricating a semiconductor device is provided in which a thin substrate having semiconductor chips is diced in a state where the thin substrate is attached to a carrier. This may be performed in order to prevent an active surface of each of the semiconductor chips, which is bonded to the carrier, from being damaged.

In accordance with one embodiment, a method of fabricating a semiconductor device comprises attaching a semiconductor substrate to a carrier using a carrier fixing layer, the semiconductor substrate including a plurality of first semiconductor chips; forming gaps between adjacent ones of the first semiconductor chips; and filling the gaps with one or more chemicals, said forming the gaps including removing portions of the semiconductor substrate to expose the carrier fixing layer through the gaps between the adjacent ones of the first semiconductor chips, and said filling the gaps including filling the gaps with the one or more chemicals to remove portions of the carrier fixing layer exposed in respective ones of the gaps.

The gaps may be filled with the one or more chemicals to remove the portions of the carrier fixing layer interposed between the first semiconductor chips and the carrier. Removing the one or more chemicals may be performed after the portions of the carrier fixing layer have been removed by the one or more chemicals.

Each of the first semiconductor chips may comprise a first surface and a second surface which are opposite each other, and the attaching the carrier may include attaching the carrier to the first surface of each of the first semiconductor chips. The method may further include attaching the second surface of each of the first semiconductor chips to an adhesive layer after the filling of the gaps with the one or more chemicals, and separating the carrier from the first semiconductor chips after the attaching of the second surface to the adhesive layer.

The gaps may be filled with the one or more chemicals for a time sufficient to allow each of the first semiconductor chips to be attached to the carrier by substantially a first width of the carrier fixing layer, the first width less than a second width of each of the first semiconductor chips.

The gaps may be filled with the one or more chemicals for a time sufficient to allow portions of the carrier fixing layer to be removed under the first semiconductor chips.

The method may further include electrically connecting a plurality of second semiconductor chips to respective ones of the first semiconductor chips. The electrically connecting may be performed between the attaching of the semiconductor substrate to the carrier and the forming of the gaps. The method may further include forming a molding material to cover the semiconductor substrate and the second semiconductor chips before the forming of the gaps.

In accordance with another embodiment, a method of fabricating a semiconductor device comprises attaching a semiconductor substrate to a carrier using a carrier fixing layer, the semiconductor substrate including a plurality of first semiconductor chips, each of the first semiconductor chips comprising a first surface opposing a second surface; forming gaps in the semiconductor substrate, each gap formed between adjacent ones of the first semiconductor chips; irradiating light to each of the gaps to remove portions of the carrier fixing layer corresponding to respective ones of the gaps, said attaching the carrier including attaching the carrier to the first surface of each of the first semiconductor chips. The light may be laser light or ultraviolet light.

The forming of the gaps may include removing portions of the semiconductor substrate to expose the carrier fixing layer in the gaps between adjacent ones of the first semiconductor chips.

The irradiating of the light may include irradiating the light into the gaps through the carrier.

The irradiating of the light may include irradiating the light into the gaps from a source facing the second surfaces of the semiconductor chips.

The irradiating of the light may include irradiating the light into the gaps to remove portions of the carrier fixing layer located between respective ones of the first semiconductor chips and the carrier.

In accordance with another embodiment, a method of fabricating a semiconductor device comprises attaching a semiconductor substrate to a carrier using a carrier fixing layer, the semiconductor substrate including a plurality of semiconductor chips; forming gaps between adjacent ones of the first semiconductor chips; and forming first separation spaces in portions of the carrier fixing layer corresponding to the gaps, said forming the first separation spaces including removing portions of the carrier fixing layer interposed between the carrier and the semiconductor chips.

The forming of the first separation spaces may comprise removing the portions of the carrier fixing layer interposed between the carrier and the semiconductor chips by filling the gaps with one or more chemicals.

The second separation spaces in the carrier fixing layer corresponding to the gaps may be formed by irradiating light to the carrier fixing layer through the gaps and the first separation spaces, each of the second separation spaces smaller than the first separation spaces.

The forming of the first separation spaces comprises increasing the width of the second separation spaces by filling the gaps and the second separation spaces with one or more chemicals.

The semiconductor substrate may be attached to the semiconductor chips by remaining portions of the carrier fixing layer after the forming the first separation spaces.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative foi ins, embodiments thereof are shown by way of example in the drawings and will herein be described in detail. It should be understood, however, that there is no intent to limit example embodiments to the particular forms disclosed, but to the contrary, example embodiments are to cover all modifications, equivalents and alternatives in the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

In the drawings, it is understood that the thicknesses of layers and regions may be exaggerated for clarity. It will also be understood that when a layer is referred to as being "on" another layer or substrate, it can be directly on the other layer or substrate or intervening layers may also be present. Like reference numerals in the drawings denote like elements, and thus their description will not be repeated. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
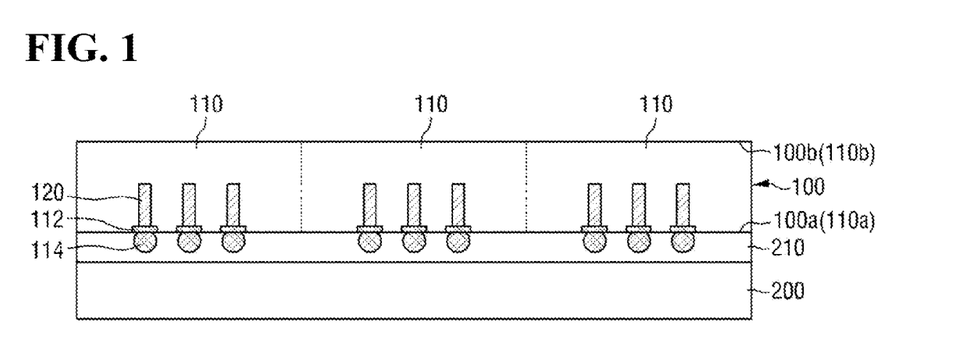
FIGS. 1 through 6 show operations included in an embodiment of a method of fabricating a semiconductor device.

FIGS. 1 through 6 show an embodiment of a method of fabricating a semiconductor device. Referring to FIG. 1, a semiconductor substrate 100 in which a plurality of first semiconductor chips 110 are arranged is attached to a carrier 200. The semiconductor substrate 100 is fixed to the carrier 200 using a carrier fixing layer 210 interposed between the semiconductor substrate 100 and the carrier 200.

The semiconductor substrate 100 includes a first surface 100*a* and a second surface 100*b* which are opposite each other. The first surface 100*a* and the second surface 100*b* of the semiconductor substrate 100 may be, for example, the front and back surfaces of the semiconductor substrate 100. The semiconductor substrate 100 may be, for example, a silicon substrate or a substrate made of another material such as silicon germanium, indium antimonide, lead telluride, indium arsenide, indium phosphide, gallium arsenide, or gallium antimonide.

Each of the first semiconductor chips 110 arranged in the semiconductor substrate 100 includes a first surface 110*a* and a second surface 110*b*. The first surface 110*a* and the second surface 110*b* may correspond to the first surface 100*a* and the second surface 100*b* of the semiconductor substrate 100. The first semiconductor chips 110 may be, for example, memory chips or logic chips.

If the first semiconductor chips 110 are logic chips, they may be designed in various ways in view of operations to be performed by the first semiconductor chips 110.

If the first semiconductor chips 110 are memory chips, the memory chips may be, for example, nonvolatile memory chips. For example, the memory chips may be flash memory chips such as but not limited to NAND flash memory chips or NOR flash memory chips. In other embodiments, the memory chips may be phase-change random access memories (PRAMs), magneto-resistive random access memories (MRAMs), or resistive random access memories (RRAMs).

Each of the first semiconductor chips 110 includes first bottom pads 112 and through electrodes 120. In this embodiment, the first bottom pads 112 are formed on the first surface 110a of each of the first semiconductor chips 110. The through electrodes 120 are respectively connected to the first bottom pads 112 and extend in a thickness direction of each of the first semiconductor chips 110, e.g., in the direction of the second surface 110b of each of the first semiconductor chips 110.

In FIG. 1, the through electrodes 120 are buried in each of the first semiconductor chips 110. That is, the through electrodes 120 are buried in the semiconductor substrate 100. However, the through electrodes 120 may be exposed in a subsequent process. An example of this subsequent process is described with reference to FIG. 2.

The through electrodes 120 may include, for example, one or more of copper (Cu), aluminum (Al), or tungsten (W). A liner and a barrier layer may further be formed between each of the through electrodes 120 and the semiconductor substrate 100. The barrier layer may include, for example, Ta, TaN, Ti, TiN, Ru, Co, Ni, NiB, or WN. In one embodiment, the liner may include, for example, low-k silicon oxide or carbon-doped silicon oxide.

In FIG. 1, three through electrodes 120 are formed in each of the first semiconductor chips 110. However, this is merely an example as a different number of through electrodes 120 may be included per chip in other embodiments. In addition, while the through electrodes 120 are shown as being formed in a central region of each of the first semiconductor chips 110 in FIG. 1, in other embodiments the electrodes may be located in other regions or a combination of a central region and one or more other regions.

First connection terminals 114 are formed on the first bottom pads 112, respectively. In the drawing, the first connection terminals 114 are shaped like solder balls. However, in other embodiments the first connection terminals 114 may have other shapes, e.g., a combination of pillar and solder ball types.

The carrier 200 faces the first surface 100a of the semiconductor substrate 100 and is attached to the semiconductor substrate 100. The carrier 200 may be a rigid body. For example, the carrier 200 may be, but is not limited to, a silicon substrate or a glass substrate.

The carrier fixing layer 210 is formed on the first surface 100a of the semiconductor substrate 100 to fix the semiconductor substrate 100 to the carrier 200. The carrier fixing layer 210 may include an adhesive material such as but not limited to glue. In the drawing, the carrier fixing layer 210 is shown as a single layer. However, the carrier fixing layer 210 may also be a multilayer made of materials with different properties.

Figure 2:
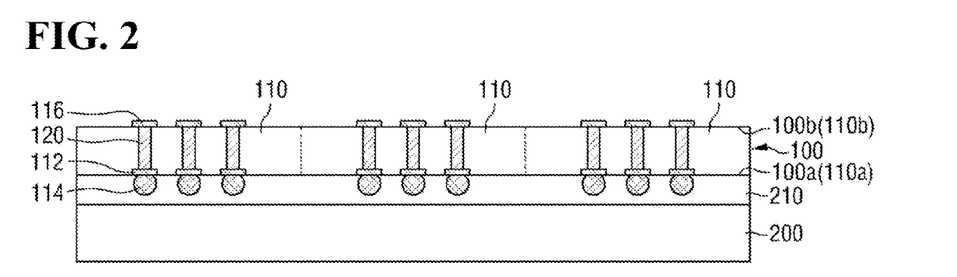

Referring to FIG. 2, an end of each of the through electrodes 120 buried in the semiconductor substrate 100 is exposed, and a first top pad 116 is formed on the exposed end of each of the through electrodes 120. As the respective ends of the through electrodes 120 are exposed, the resultant through electrodes 120 penetrate each of the first semiconductor chips 110.

More specifically, the second surface 100b of the semiconductor substrate 100 attached to the carrier 200 is partially removed to expose the through electrodes 120. Here, the exposed through electrodes 120 may protrude from the second surface 100b of the semiconductor substrate 100. However, the present embodiment is not limited thereto. For example, the through electrodes may be even with the surface 100b or even recessed therebelow. In this latter case, pads 116 may extend into the through holes to establish electrical connection with the through electrodes 120.

The second surface 100b of the semiconductor substrate 100 may be partially removed by chemical mechanical polishing (CMP). However, the present embodiment is not limited to this technique. For example, in other embodiments the second surface 100b of the semiconductor substrate 100 may be partially removed by a combination of a dry-etching process and/or a wet-etching process and CMP.

To expose the through electrodes 120, a planarization layer and/or a passivation layer may be formed on the polished second surface 100b of the semiconductor substrate 100. The planarization layer may include, e.g., a low-viscosity resin. The passivation layer may include at least one of silicon oxide and silicon nitride and may be formed by, e.g., CVD.

After the formation of the planarization layer and/or the passivation layer, the first top pads 116 are respectively formed on the exposed through electrodes 120. The first top pads 116 are connected to the through electrodes 120 and are formed on the second surface 100b of the semiconductor substrate 100. That is, the first top pads 116 are formed on the second surface 110b of each of the first semiconductor chips 110.

Figure 3:
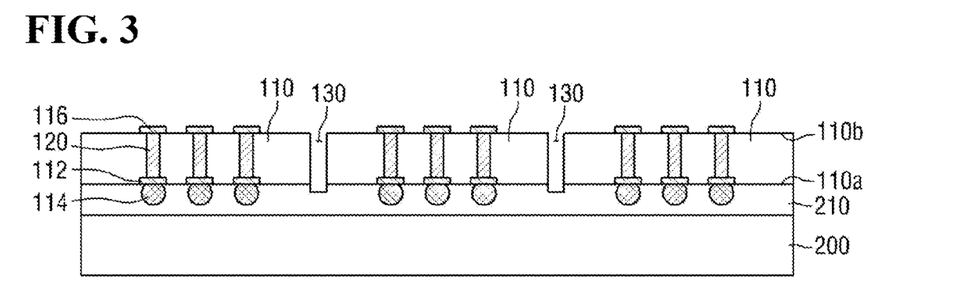

Referring to FIG. 3, the first semiconductor chips 110 arranged in the semiconductor substrate 100 are separated from each other. The separation of the first semiconductor chips 110 may result in the formation of a chip gap 130 between adjacent ones of the first semiconductor chips 110, e.g., each chip gap 130 separates one first semiconductor chips 110 from another first semiconductor chip 110.

The first semiconductor chips 110 may be separated, for example, by dicing the semiconductor substrate 100. The dicing process may be performed using, for example, a saw blade. Using the saw blade, the chip gap 130 may be formed to extend in a direction from the second surface 110b of each of the first semiconductor chips 110 to the first surface 110a of each of the first semiconductor chips 110.

Since each of the first semiconductor chips 110 is separated from another first semiconductor chip 110 by the chip gap 130, the carrier fixing layer 210 is exposed by the chip gap 130. In other words, a portion of the carrier fixing layer 210 is exposed between the first semiconductor chips 110.

In one embodiment, the carrier 200 may not be exposed by the dicing process for separating the first semiconductor chips 110. That is, a thickness of a portion of the carrier fixing layer 210 which is removed by the dicing process may be smaller than a thickness of the carrier fixing layer 210. Therefore, a portion of the carrier fixing layer 210 may remain on the carrier 200 located directly under the chip gap 130. However, this is merely an example used for ease of description. In an alternative embodiment, the separation operation may be performed to a depth which exposes a portion of the carrier 200 in the chip gap 130.

In FIG. 3, a portion of the carrier fixing layer 210 under the chip gap 130 is removed using a dicing process, as will be described below. That is, in a dicing process for separating the first semiconductor chips 110, the chip gap 130 which separates the first semiconductor chips 110 may be formed, but a portion of the carrier fixing layer 210 may not be removed.

Figure 4:
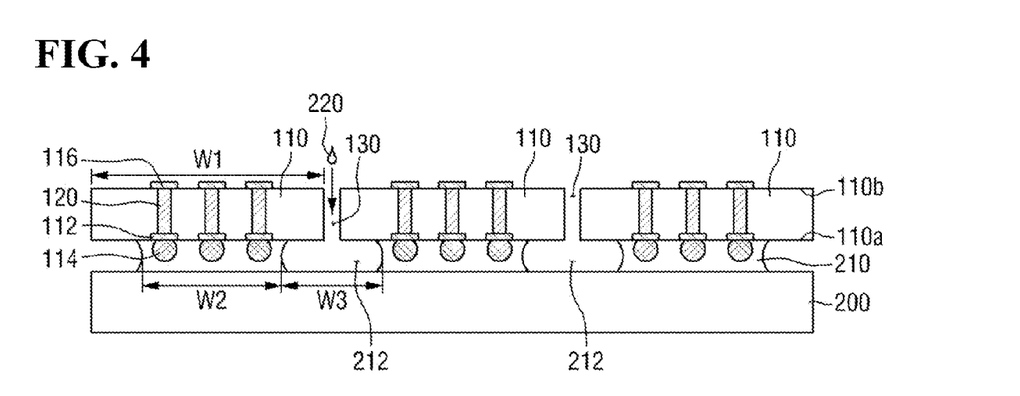

Referring to FIG. 4, a portion of the carrier fixing layer 210 interposed between the first semiconductor chips 110 and the carrier 200 is removed by filling the chip gap 130 with one or more chemicals 220. The removal of the portion of the carrier fixing layer 210 may result in the formation of a first separation space 212 in the carrier fixing layer 210.

In other words, the one or more chemicals 220 in the chip gap 130 may remove a portion of the carrier fixing layer 210 between the carrier 200 and the first semiconductor chips 110, thereby forming the first separation space 212 in the carrier fixing layer 210.

More specifically, the chip gap 130 which separates the first semiconductor chips 110 receives the one or more chemicals 220. To fill the chip gap 130 with the chemicals 220, the carrier 200 to which the first semiconductor chips 110 separated by the chip gap 130 are attached may be immersed in the chemicals 220. For example, a cleaner solution may be sprayed onto the carrier 200 or the carrier 200 may be immersed in the cleaner solution. In addition, to fill the chip gap 130 with the chemicals 220, the second surface 110b of each of the first semiconductor chips 110 may be coated with the chemicals 220, so that the chemicals 220 can flow into the chip gap 130.

In the method of fabricating a semiconductor device according to the present embodiment, a case where the carrier 200 to which the first semiconductor chips 110 are attached is immersed in the chemicals 220 may be more particularly described. Because the carrier 200 to which the first semiconductor chips 110 are attached is immersed in the chemicals 220, the chemicals 220 may flow into the chip gap 130 formed between the first semiconductor chips 110. The chemicals 220 flowing into the chip gap 130 may completely or partially fill the chip gap 130. The chemicals 220 may include, for example, a reactant that can selectively dissolve and remove the carrier fixing layer 210.

Since a portion of the carrier fixing layer 210 is exposed by the chip gap 130, the portion of the carrier fixing layer 210 exposed between the first semiconductor chips 110 is removed by the chemicals 220 that fill the chip gap 130. Initially, the chemicals 220 remove the portion of the carrier fixing layer 210 exposed between the first semiconductor chips 110. However, as a period of time during which the carrier fixing layer 210 is exposed to the chemicals 220 increases, the chemicals 220 begin to remove more of the carrier fixing layer 210 interposed between the first semiconductor chips 110 and the carrier 200. That is, the carrier fixing layer 210 begins to be undercut under the first semiconductor chips 110.

As the period of time during which the carrier fixing layer 210 is exposed to the chemicals 220 increases, the amount of the carrier fixing layer 210 that is undercut increases.

The chemicals 220 filling the chip gap 130 removes the carrier fixing layer 210 interposed between the carrier 200 and the first semiconductor chips 110. However, the chemicals 220 filling the chip gap 130 may remove only a portion of the carrier fixing layer 210 interposed between the carrier 200 and the first semiconductor chips 110. That is, a portion of the carrier fixing layer 210 which is not removed by the chemicals 220 may remain between the first semiconductor chips 110 and the carrier 200. Therefore, after the chemical-filling process, the first semiconductor chips 110 may be attached and fixed to the carrier 200 only by the remaining portion of the carrier fixing layer 210. The aforementioned period of time may be set or otherwise adjusted to regulate the extent of this attachment.

After a portion of the carrier fixing layer 210 interposed between the carrier 200 and the first semiconductor chips 110 is removed by filling the chip gap 130 with the chemicals 220, the chemicals 220 filling the chip gap 130 are removed. To remove residues of the chemicals 220, the carrier 200 to which the first semiconductor chips 110 are attached may be cleaned.

In one embodiment, the carrier fixing layer 210 between the first semiconductor chips 110 and the carrier 200 connects and fixes the first semiconductor chips 110 to the carrier 200 in a state where the carrier fixing layer 210 is undercut under the first semiconductor chips 110.

Each of the first semiconductor chips 110 has a first width w1. The remaining portion of the carrier fixing layer 210 which was not removed by the chemicals 220 has a second width w2. Since the remaining portion of the carrier fixing layer 210 is undercut under each of the first semiconductor chips 110, the width w1 of each of the first semiconductor chips 110 is greater than the width w2 of the remaining portion of the carrier fixing layer 210. In addition, the remaining portion of the carrier fixing layer 210 is completely overlapped by each of the first semiconductor chips 110.

However, if the size of each of the first semiconductor chips 110 is reduced with a reduction performed based on the device design rule, the width w1 of each of the first semiconductor chips 110 may be smaller than the width w2 of the remaining portion of the carrier fixing layer 210.

As previously indicated, the first separation space 212 is formed by filling the chip gap 130 with the chemicals 220. The first separation space 212 is formed in the carrier fixing layer 210 and is surrounded by the remaining portion of the carrier fixing layer 210, the carrier 200, the first surface 110a of each of adjacent first semiconductor chips 110, and the chip gap 130. The first separation space 212 is spatially connected to the chip gap 130.

The remaining portion of the carrier fixing layer 210 is separated from another remaining portion between the first semiconductor chips 110 and the carrier 200. That is, each remaining portion of the carrier fixing layer 210 exists in the form of an island on the carrier 200.

The first separation space 212 may have a third width w3. The first separation space 212 contacts a portion of the first surface 110a of each of adjacent first semiconductor chips 110. That is, a portion of the first separation space 212 is overlapped by each of the adjacent first semiconductor chips 110. A width of a portion of the first separation space 212 which is not overlapped by each of the adjacent the first semiconductor chips 110 may be substantially equal to a width of the chip gap 130.

In FIG. 4, after a portion of the carrier fixing layer 210 interposed between the carrier 200 and the first semiconductor chips 110 is removed using the chemicals 220, the carrier 200 is exposed by the first separation space 212 and the chip gap 130. However, in other embodiments, the carrier 200 may not be exposed or may only be partially exposed.

That is, while a portion of the carrier fixing layer 210 is exposed by the chemicals 220, the carrier 200 may not be exposed. Accordingly, the first separation space 212 can be formed as a recess in the carrier fixing layer 210.

Figure 5:
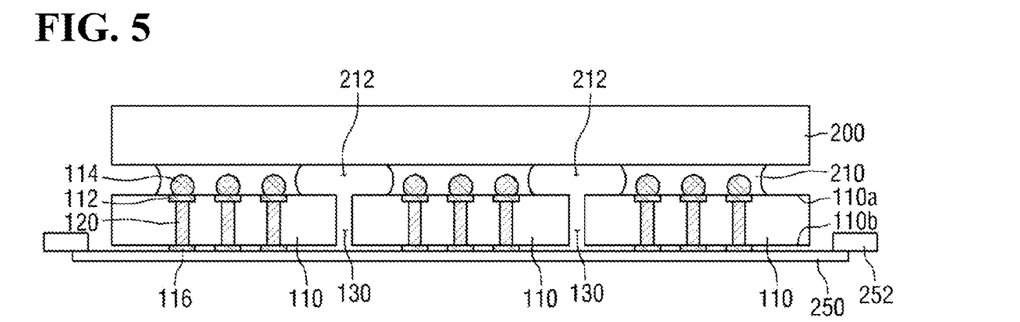

Referring to FIG. 5, the second surface 110b of each of the separated first semiconductor chips 110 on which the first top pads 116 are formed is fixed to a wafer ring 252 using an adhesive layer 250. More specifically, the second surface 110b of each of the first semiconductor chips 110 attached to the carrier 200 by the remaining portion of the carrier fixing layer 210 is attached to the adhesive layer 250 and thus fixed to the wafer ring 252.

That is, the second surface 110b of each of the first semiconductor chips 110 having the first top pads 116 is placed to face the adhesive layer 250 attached to the wafer ring 252. In this state, the first semiconductor chips 110 are attached to the adhesive layer 250. The first surface 110a of each of the first semiconductor chips 110, which is opposite the second surface 110b of each of the first semiconductor chips 110 to which the adhesive layer 250 is attached, is still attached to the carrier 200 by the carrier fixing layer 210. The adhesive layer 250 may be, but is not limited to, a die attach film (DAF).

Figure 6:
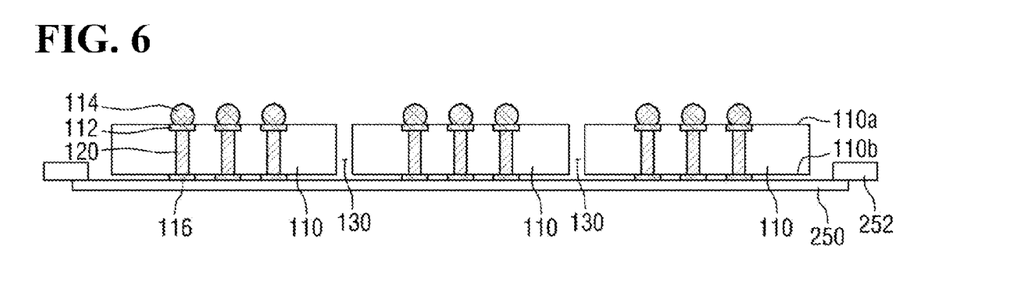

Referring to FIG. 6, the carrier 200 is separated from the first semiconductor chips 110 attached to the adhesive layer 250. After separation of the carrier 200, only the first semiconductor chips 110 remain on the adhesive layer 250. To separate the carrier 200 from the first semiconductor chips 110, a physical force may be applied to the carrier fixing layer 210, which is attached to the first surface 110a of each of the first semiconductor chips 110, and the carrier 200. Since the first semiconductor chips 110 are attached to the adhesive layer 250, even if the physical force is applied to the carrier 200, the first semiconductor chips 110 may not be separated from the adhesive layer 250.

Alternatively, the carrier 200 may be separated from the first semiconductor chips 110 by removing the carrier fixing layer 210 formed between the first surface 110a of each of the first semiconductor chips 110 and the carrier 200. The carrier fixing layer 210 may be removed, for example, by a thermal sliding method, a laser irradiation method, or a chemical method.

After the separation and removal of the carrier fixing layer 210 and the carrier 200 from the first semiconductor chips 110, if a residue of the carrier fixing layer 210 exists on the first surface 110a of each of the first semiconductor chips 110, the residue may be removed using, for example, a chemical removal method.

The method of fabricating a semiconductor device in FIGS. 1 through 6 is shown for only one semiconductor substrate 100. However, in other embodiments, a stack of multiple semiconductor substrates may be fixed to the carrier 200, and the stack of semiconductor substrates may be diced to form the chip gap 130. As a result, multiple stacks of semiconductor chips having equal widths may be formed.

A modified embodiment of the method of fabricating a semiconductor device will now be described. The modified example may be identical to the previous embodiment except that it applied to a semiconductor substrate 100 without through electrodes.

Figure 7:
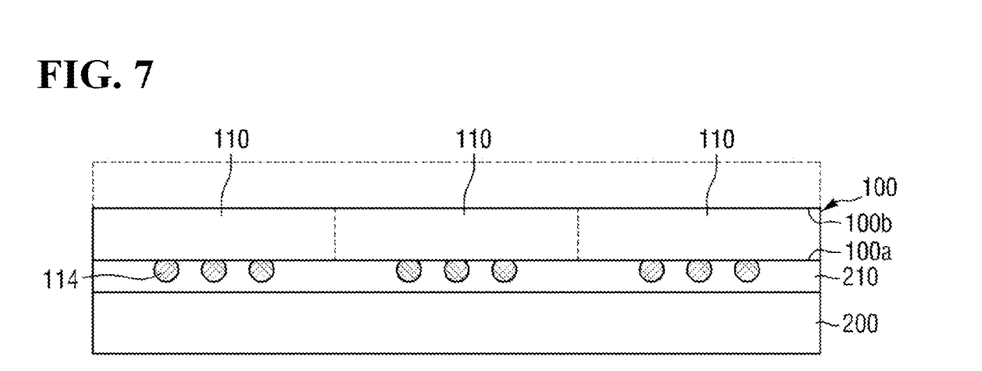
FIG. 7 is a view illustrating a modified example of the method of fabricating a semiconductor device according to FIGS. 1 through 6.

Referring to FIG. 7, the semiconductor substrate 100 in which a plurality of first semiconductor chips 110 are arranged is attached to a carrier 200. The semiconductor substrate 100 is fixed to the carrier 200 using a carrier fixing layer 210 interposed between the semiconductor substrate 100 and the carrier 200. The first semiconductor chips 110 do not include through electrodes buried therein.

Specifically, the semiconductor substrate 100 in which the first semiconductor chips 110 without through electrodes are arranged is provided. The carrier fixing layer 210 is interposed between the semiconductor substrate 100 and the carrier 200, thereby attaching a first surface 100a of the semiconductor substrate 100 to the carrier 200. After the first surface 100a of the semiconductor substrate 100 is attached to the carrier 200, a second surface 100b of the semiconductor substrate 100 is polished to reduce a thickness of the semiconductor substrate 100.

The first semiconductor chips 110 without through electrodes may be, for example, memory devices or logic devices.

After the thickness of the semiconductor substrate 100 is reduced, the first semiconductor chips 110 are fabricated with reference to the fabrication processes of FIGS. 3 through 6. That is, a chip gap 130 is formed between the first semiconductor chips 110 by a dicing process for separating the first semiconductor chips 110. Then, the chip gap 130 is filled with one or more chemicals 220 to remove a portion of the carrier fixing layer 210 between the carrier 200 and the first semiconductor chips 110. Next, the first semiconductor chips 110 are attached to an adhesive layer 250, and then the carrier 200 and the carrier fixing layer 210 are separated and removed from the first semiconductor chips 110.

The method of fabricating a semiconductor device according to the present embodiment may provide the following effects.

First, effects that can be obtained in terms of fabrication yield are as follows. After the un-diced semiconductor substrate 100, in which the first semiconductor chips 110 fixed to the carrier 200 by the carrier fixing layer 210 are arranged, is attached to the adhesive layer 250, the carrier 200 may be removed. In this case, if the semiconductor substrate 100 is broken by stress applied to the semiconductor substrate 100 in the process of removing the carrier 200, the semiconductor substrate 100 itself becomes defective.

In accordance with one or more embodiments described herein. However, even if a problem occurs in the process of removing the carrier 200, a first semiconductor chip 110 only in a region where the problem occurred may be damaged and/or become defective. Therefore, a unit of defect occurrence is reduced from a semiconductor substrate to a semiconductor chip. Consequently, this can improve the fabrication yield.

Effects that can be obtained in terms of the fabrication process are as follows. As described above with reference to FIG. 4, if the chip gap 130 formed by dicing the semiconductor substrate 100 is filled with the chemicals 220, a portion of the carrier fixing layer 210 between the first semiconductor chips 110 and the carrier 200 is removed by the chemicals 220. That is, a contact area between the carrier fixing layer 210 and each of the first semiconductor chips 110 is reduced.

Therefore, even a small force can easily lift the carrier 200 off the first semiconductor chips 110, thereby removing the carrier 200 from the first semiconductor chips 110. This improves the ease with which the semiconductor device fabrication process is performed.

A method of fabricating a semiconductor device according to another embodiment will now be described. Referring to FIGS. 1 through 3, a semiconductor substrate 100 in which a plurality of first semiconductor chips 110 are arranged is attached to a carrier 200 using a carrier fixing layer 210. Each of the first semiconductor chips 110 includes through electrodes 120 which penetrate the first semiconductor chip 110. The first semiconductor chips 110 are separated from each other by dicing the semiconductor substrate 100. A chip gap 130 is formed between the first semiconductor chips 110.

Figure 8:
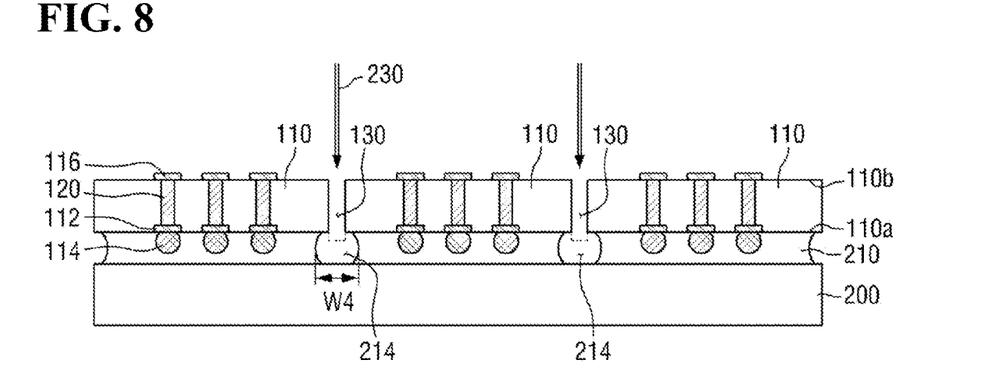
FIGS. 8 and 9 show operations included in another embodiment of a method of fabricating a semiconductor device.

Referring to FIG. 8, a portion of the carrier fixing layer 210 interposed between the first semiconductor chips 110 and the carrier 200 is removed by irradiating light 230 to the chip gap 130 from above each of the first semiconductor chips 110. In other words, the light 230 (such as laser light) is irradiated to the carrier fixing layer 210 exposed by the chip gap 130 from above a second surface 110b of each of the first semiconductor chips 110. Then, the irradiated light 230 may remove a portion of the carrier fixing layer 210 interposed between the first semiconductor chips 110 and the carrier 200.

Depending on the type of the carrier fixing layer 210 and the type of the light 230 irradiated, a second separation space 214 may be formed as shown in FIG. 8 or the carrier fixing layer 210 may be damaged by the irradiation of the light 230. In the latter case, the second separation space 214 may not be formed and the adhesive strength of the carrier fixing layer 210 may only be reduced.

When a portion of the carrier fixing layer 210 interposed between the first semiconductor chips 110 and the carrier 200 is removed, the second separation space 214 is formed in the carrier fixing layer 210.

More specifically, after the chip gap 130 is formed between the first semiconductor chips 110, the light 230 emitted from a light source located above the second surface 110b of each of the first semiconductor chips 110 is irradiated to the chip gap 130. The light 230 irradiated to the chip gap 130 passes through the chip gap 130 to reach the carrier fixing layer 210 exposed by the chip gap 130. The light 230 may be light that can react with the carrier fixing layer 210 or melt the carrier fixing layer 210. For example, the light 230 may be, for example, ultraviolet (UV) rays or laser beams.

If the carrier fixing layer 210 includes a material that can be decomposed by reacting with a certain wavelength of UV rays or laser beams, the exposed carrier fixing layer 210 in a region irradiated with the light 230 may be decomposed into, e.g., a gas by absorbing the light 230. When a portion of the carrier fixing layer 210 is removed by absorbing the light 230, a space as large as the removed portion of the carrier fixing layer 210 is formed.

Alternatively, the intensity of the UV rays or laser beams may be increased to melt away the exposed carrier fixing layer 210 in the region irradiated with the light 230 with heat. When a portion of the carrier fixing layer 210 is removed by the light 230, a space as large as the removed portion of the carrier fixing layer 210 is formed.

If the light 230 is irradiated to the carrier fixing layer 210 exposed by the chip gap 130, a portion of the carrier fixing layer 210 reacts with the light 230. Therefore, the portion of the carrier fixing layer 210 may be removed by the light 230, and the second separation space 214 may be formed in the removed portion of the carrier fixing layer 210. In this embodiment, the second separation space 214 is formed within the carrier fixing layer 210.

As shown, the second separation space 214 may have a fourth width w4. In the present embodiment, the width w4 of the second separation space 214 is greater than a width of the chip gap 130. As such, the second separation space 214 may contact or otherwise extend over a portion of a first surface 110a of each of adjacent first semiconductor chips 110. That is, a portion of the second separation space 214 may be overlapped by each of the adjacent first semiconductor chips 110. In addition, the light 230 irradiated to the carrier fixing layer 210 exposed by the chip gap 130 may cause the carrier fixing layer 210 between the first semiconductor chips 110 and the carrier 200 to be undercut under the first semiconductor chips 110. (In an alternative embodiment, width w4 may be equal to the width of the chip gap).

In FIG. 8, after the light 230 is irradiated to the carrier fixing layer 210 exposed by the chip gap 130, the carrier 200 is exposed by the second separation space 214 and the chip gap 130. In other embodiments, the irradiation may only partially expose a surface of the carrier 200 or may not expose any of this carrier surface. That is, while a portion of the exposed carrier fixing layer 210 is removed by the light 230, in at least one embodiment the carrier 200 may not be exposed. In this case, the second separation space 214 may be formed as a recess in the carrier fixing layer 210.

As shown in FIG. 8, the light 230 is irradiated from above the second surface 110b of each of the first semiconductor chips 110. However, the light 230 may also or alternatively be irradiated from under the first surface 110a of each of the first semiconductor chips 110, that is, from under the carrier 200. An example of this process will now be described with reference to FIG. 9

Figure 9:
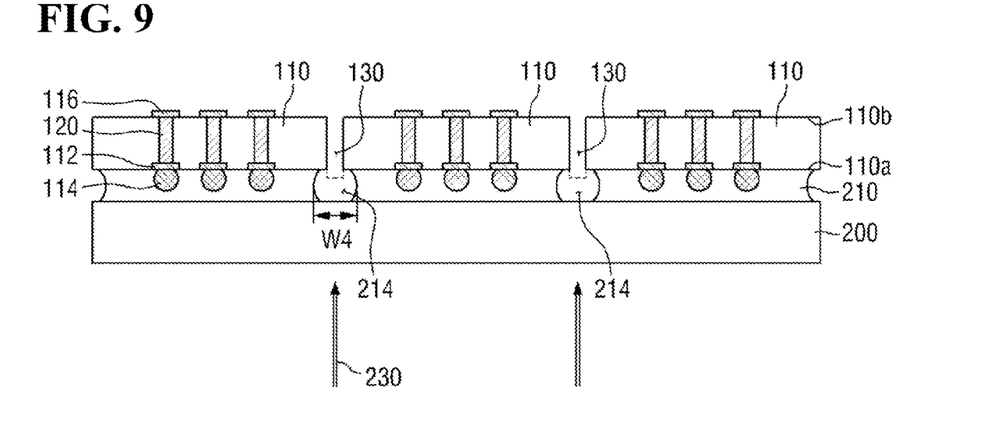

Referring to FIG. 9, a portion of the carrier fixing layer 210 interposed between the first semiconductor chips 110 and the carrier 200 is removed by irradiating the light 230 to the chip gap 130 from under the carrier 200. In other words, the light 230 incident from under the first surface 110a of each of the first semiconductor chips 110 passes through the carrier 200 to reach the carrier fixing layer 210 exposed by the chip gap 130. As a result, a portion of the carrier fixing layer 210 interposed between the first semiconductor chips 110 and the carrier 200 may be removed.

The removal of the portion of the carrier fixing layer 210 interposed between the first semiconductor chips 110 and the carrier 200 results in the formation of the second separation space 214 in the carrier fixing layer 210. Since the light 230 incident from under the carrier 200 passes through the carrier 200 to reach the carrier fixing layer 210 exposed by the chip gap 130, the carrier 200 may be, for example, a transparent carrier.

Referring to FIG. 4, a portion of the carrier fixing layer 210 interposed between the first semiconductor chips 110 and the carrier 200 is removed by filling the chip gap 130 with one or more chemicals 220. The removal of the portion of the carrier fixing layer 210 may result in the formation of a first separation space 212 in the carrier fixing layer 210. In other words, the chemicals 220 filling the chip gap 130 may flow into the second separation space 214 to entirely or partially fill the second separation space 214. The chemicals 220 filling the second separation space 214 may form the first separation space 212 in the carrier fixing layer 210.

The width w4 of the second separation space 214 may be smaller than a width w3 of the first separation space 212. Specifically, the chemicals 220 filling the second separation space 214 may remove a portion of the carrier fixing layer 210 interposed between the first semiconductor chips 110 and the carrier 200. As a result, the width w4 of the second separation space 214 is increased, thereby forming the first separation space 212 wider than the second separation space 214.

Referring to FIGS. 5 and 6, the first semiconductor chips 110 are attached to an adhesive layer 250, and then the carrier fixing layer 210 and the carrier 200 are separated and removed from the first semiconductor chips 110. Therefore, only the first semiconductor chips 110 remain on the adhesive layer 250.

Figure 10:
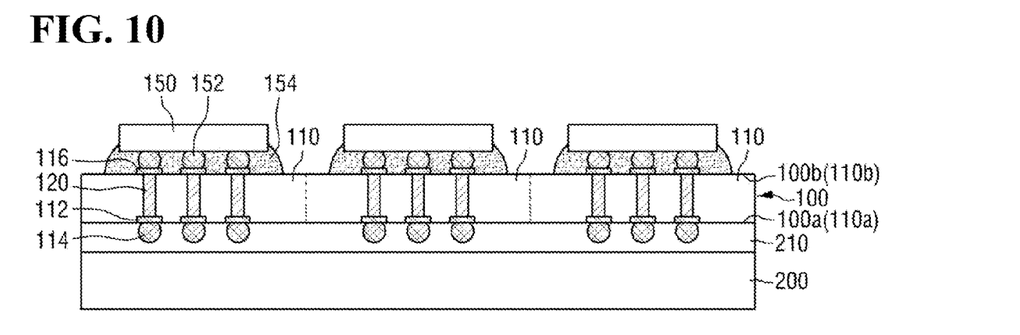
FIGS. 10 through 12 show operations included in another embodiment of a method of fabricating a semiconductor device.
Figure 11:
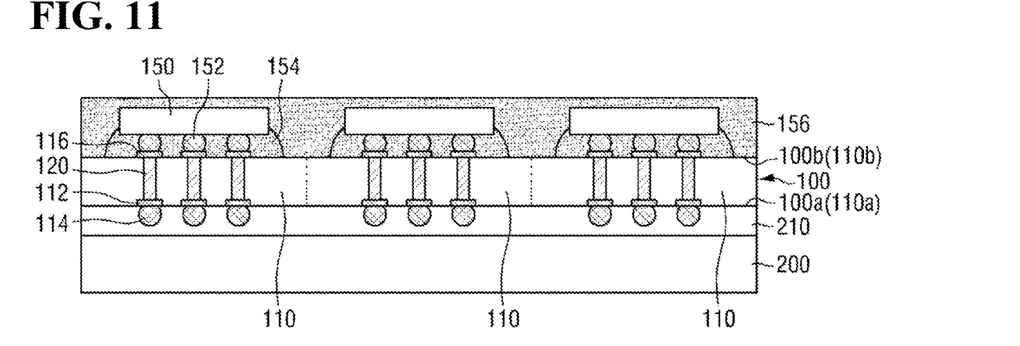
Figure 12:
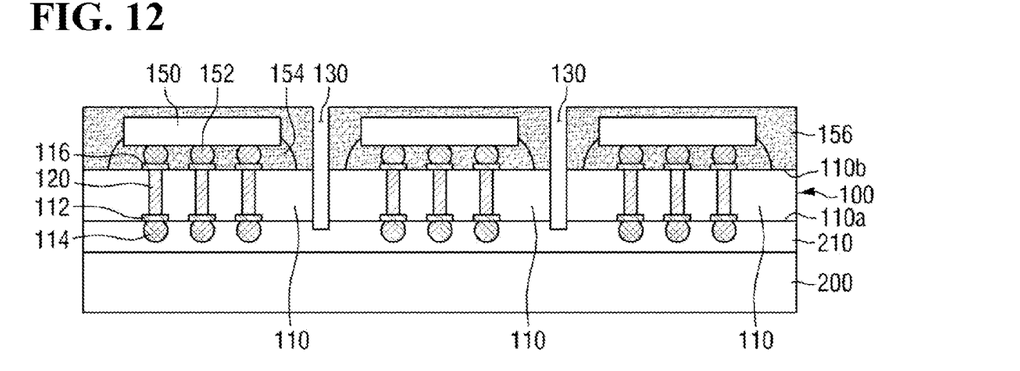

FIGS. 10 through 12 are views illustrating intermediate processes included in another embodiment of a method of fabricating a semiconductor device. Referring to FIG. 10, a plurality of second semiconductor chips 150 are electrically connected to a semiconductor substrate 100 in which a plurality of first semiconductor chips 110 are arranged. In other words, the second semiconductor chips 150 corresponding to the first semiconductor chips 110 are electrically connected to the first semiconductor chips 110, respectively.

More specifically, after the semiconductor substrate 100 is attached to a carrier 200, the second semiconductor chips 150 electrically connected to the first semiconductor chips 110, respectively, are mounted on a second surface 100b of the semiconductor substrate 100. That is, each of the second semiconductor chips 150 is mounted on a second surface 110b of a corresponding one of the first semiconductor chips 110.

The first semiconductor chips 110 and the second semiconductor chips 150 may be electrically connected by connection terminals 152 formed on the second semiconductor chips 150. The connection terminals 152 formed on each of the second semiconductor chips 150 are connected to first top pads 116 of a corresponding one of the first semiconductor chips 110. As shown in FIG. 10, the connection terminals 152 formed on each of the second semiconductor chips 150 are solder balls. However, in other embodiments the connection terminals 152 may also be solder bumps or another type of connection shape or structure. The second semiconductor chips 150 may be, for example, logic chips or memory chips.

Each of the second semiconductor chips 150 may be a semiconductor chip fabricated using, for example, the method of fabricating a semiconductor device described above with reference to FIGS. 3 through 7. However, different methods for making chips 150 may be used in other embodiments.

Additionally, a molding material 154 may formed between each of the first semiconductor chips 110 and a corresponding one of the second semiconductor chips 150. After the second semiconductor chips 150 are electrically connected to the first semiconductor chips 110, respectively, the molding material 154 may be formed in spaces between the semiconductor substrate 100 and each of the second semiconductor chips 150. In other words, the molding material 154 may fill a space between each of the first semiconductor chips 110 and a corresponding one of the second semiconductor chips 150.

The molding material 154, for example, may be injected into the space between each of the first semiconductor chips 110 and a corresponding one of the second semiconductor chips 150 using a dispenser or other technique. The molding material 154 may be a liquid underfill material and may include, for example, epoxy resin or two or more silicon hybrid materials. As shown in FIG. 10, the molding material 154 may cover part of sidewalls of each of the second semiconductor chips 150. However, this may not be the case in other embodiments.

Referring to FIG. 11, a wafer-level molding material 156 may be formed on the second surface 100b of the semiconductor substrate 100. The wafer-level molding material 156 may cover the second semiconductor chips 150. The wafer-level molding material 156 may be a liquid underfill material and may include, for example, epoxy resin or two or more silicon hybrid materials. Since the second semiconductor chips 150 are covered with the wafer-level molding material 156, they are not exposed.

In the method of fabricating a semiconductor device according to the current embodiment, a case where the second semiconductor chips 150 are not exposed because they are completely covered with the wafer-level molding material 156 is described. However, in other embodiments, the wafer-level molding material 156 may only be partially removed to expose the second semiconductor chips 150.

Referring to FIG. 12, the first semiconductor chips 110 arranged in the semiconductor substrate 100 are separated from each other, thereby forming a chip gap 130 between the first semiconductor chips 110. That is, the chip gap 130 is formed by separating each of the first semiconductor chips 110 which are electrically connected to the second semiconductor chips 150 from another first semiconductor chip 110.

In a dicing process for separating the first semiconductor chips 110, the wafer-level molding material 156 which covers the second semiconductor chips 150 and the second surface 100b of the semiconductor substrate 100 is also diced. That is, the wafer-level molding material 156 is separated into pieces of the size of a first semiconductor chip 110.

Since each of the first semiconductor chips 110 on which the second semiconductor chip 150 are mounted is separated from another first semiconductor chip by the chip gap 130, a carrier fixing layer 210 is exposed by the chip gap 130. In other words, a portion of the carrier fixing layer 210 is exposed between the first semiconductor chips 110.

In the method of fabricating a semiconductor device according to the current embodiment, the carrier 200 may not be exposed by the dicing process for separating the first semiconductor chips 110. That is, as shown in FIG. 12, only a portion of the carrier fixing layer 210 under the chip gap 130 may be removed. This may not be the case in other embodiments, e.g., the carrier fixing layer may be removed to expose a portion of the carrier 200 by the dicing process.

As described above with reference to FIGS. 4 and 6, the chip gap 130 is filled with one or more chemicals 220. As a result, a portion of the carrier fixing layer 210 interposed between the carrier 200 and the first semiconductor chips 110 may be removed. In addition, the wafer-level molding material 156 is attached to an adhesive layer 250, and then the carrier 200 and the carrier fixing layer 210 may be separated and removed from the first semiconductor chips 110.

Figure 13:
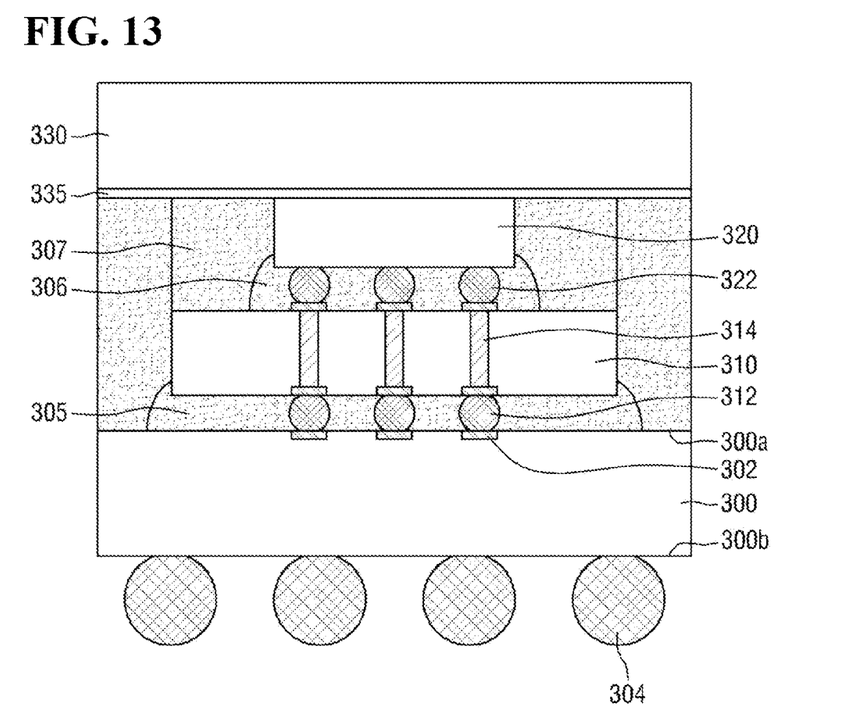
FIG. 13 shows an exemplary semiconductor package assembled using semiconductor devices fabricated according to any of the aforementioned method embodiments.

FIG. 13 shows an embodiment of a semiconductor package assembled using semiconductor devices fabricated according to one or more of the aforementioned method embodiments. Referring to FIG. 13, a lower semiconductor chip 310 and an upper semiconductor chip 320 are stacked sequentially on a mounting board 300. The lower semiconductor chip 310 and/or the upper semiconductor chip 320 may be semiconductor devices fabricated according to the aforementioned embodiments.

The lower semiconductor chip 310 is electrically connected to the mounting board 300 by lower connection terminals 312, and the upper semiconductor chip 320 is electrically connected to the lower semiconductor chip 310 by upper connection terminals 322. The lower semiconductor chip 310 includes through electrodes 314. The upper semiconductor chip 320 is electrically connected to the mounting board 300 by the through electrodes 314.

A first molding material 305 is formed in a space between the lower semiconductor chip 310 and the mounting board 300, and a second molding material 306 is formed in a space between the upper semiconductor chip 320 and the lower semiconductor chip 310. A third molding material 307 is formed around the upper semiconductor chip 320 to surround the upper semiconductor chip 320.

In addition, a fourth molding material 308 is formed on the mounting board 300 to surround the upper semiconductor chip 320 and the lower semiconductor chip 310. The third molding material 307 and the fourth molding material 308 may be formed in the same process or in different processes according to a method of assembling a semiconductor package.

A heat sink 330 which facilitates the dissipation of heat generated in the semiconductor package may be formed on the upper semiconductor chip 320. The heat sink 330 may be connected to the upper semiconductor chip 320 by a heat transfer material layer 335.

In the drawing, a width of the heat sink 330 is equal to a width of the mounting substrate 300. However, this is merely an example. In other embodiments these widths may be different.

Figure 14:
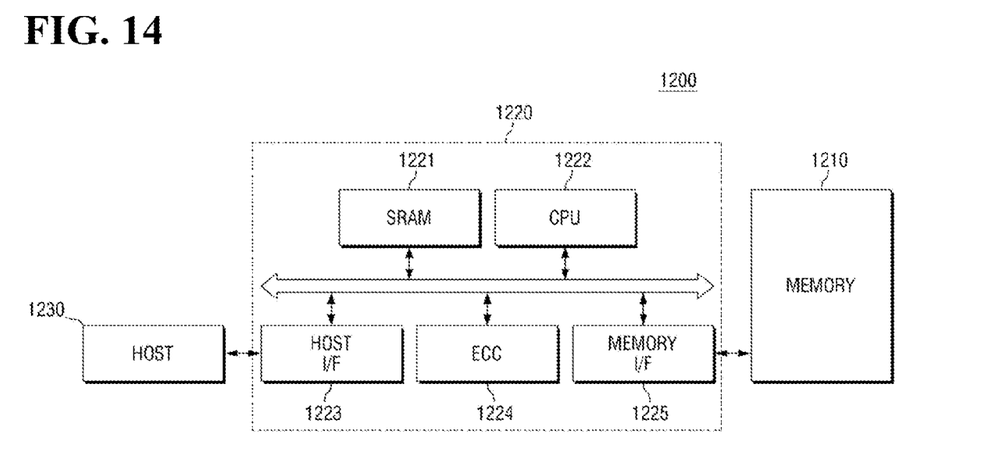
FIG. 14 is a block diagram of a memory card including a semiconductor device fabricated according to any of the aforementioned method embodiments.

FIG. 14 is a block diagram of an embodiment of a memory card 1200 including a semiconductor device fabricated according to one or more of the aforementioned embodiments. Referring to FIG. 14, a memory 1201 including the semiconductor device may be employed in the memory card 1200.

The memory card 1200 may include a memory controller 1220 which controls data exchange between a host 1230 and the memory 1210. A static random access memory (SRAM) 1221 may be used as an operation memory of a central processing unit (CPU) 1222. A host interface 1223 may include protocols used by the host 1230 to access the memory card 1200 and exchange data with the memory card 1200. An error correcting code (ECC) 1224 may detect and correct errors in data read from the memory 1210. A memory interface 1225 may interface with the memory 1210. The CPU 1222 may control the overall data exchange-related operation of the memory controller 1220.

Figure 15:
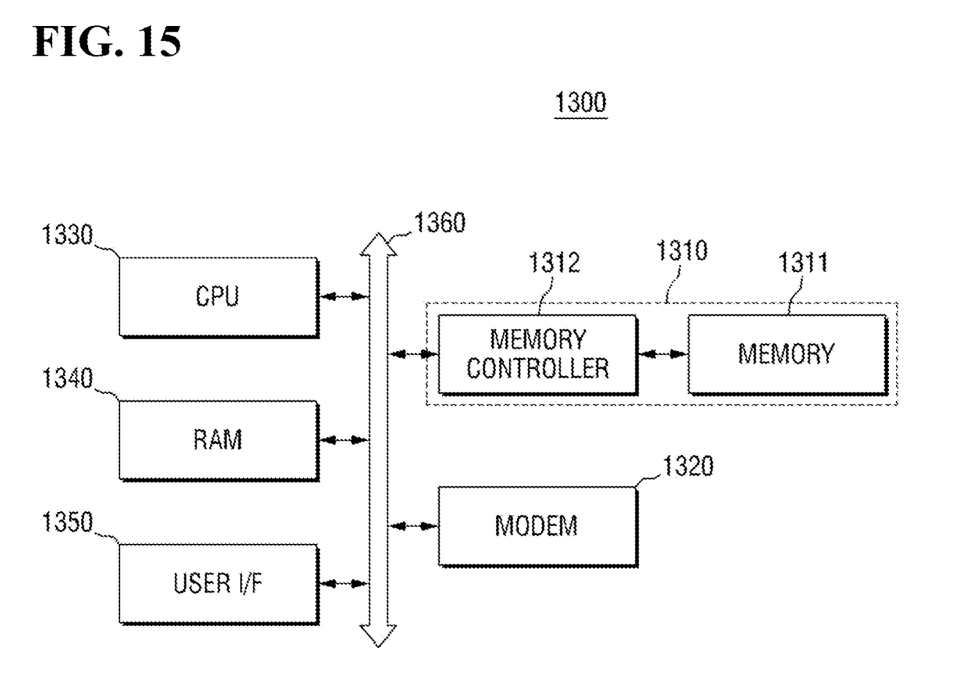
FIG. 15 is a block diagram of an information processing system using a semiconductor device fabricated according to any of the aforementioned method embodiments.

FIG. 15 is a block diagram of an embodiment of an information processing system 1300 using a semiconductor device fabricated according to one or more of the aforementioned embodiments. Referring to FIG. 15, the information processing system 1300 may include a memory system 1310 including the semiconductor device.

The information processing system 1300 may include the memory system 1310, a modem 1320, a CPU 1330, a random access memory (RAM) 1340, and a user interface 1350 which are electrically connected to a system bus 1360. The memory system 1310 may include a memory 1311 and a memory controller 1312 and may be configured in substantially the same way as the memory card 1200 of FIG. 14.

Data processed by the CPU 1330 or data received from an external device may be stored in the memory system 1310. The information processing system 1300 can be applied to a memory card, a solid-state driver (SSD), a camera image sensor, and other various chipsets. For example, the memory system 1310 may be configured to employ an SSD. In this case, the information processing system 1300 can process large-volume data in a stable and reliable manner.

Figure 16:
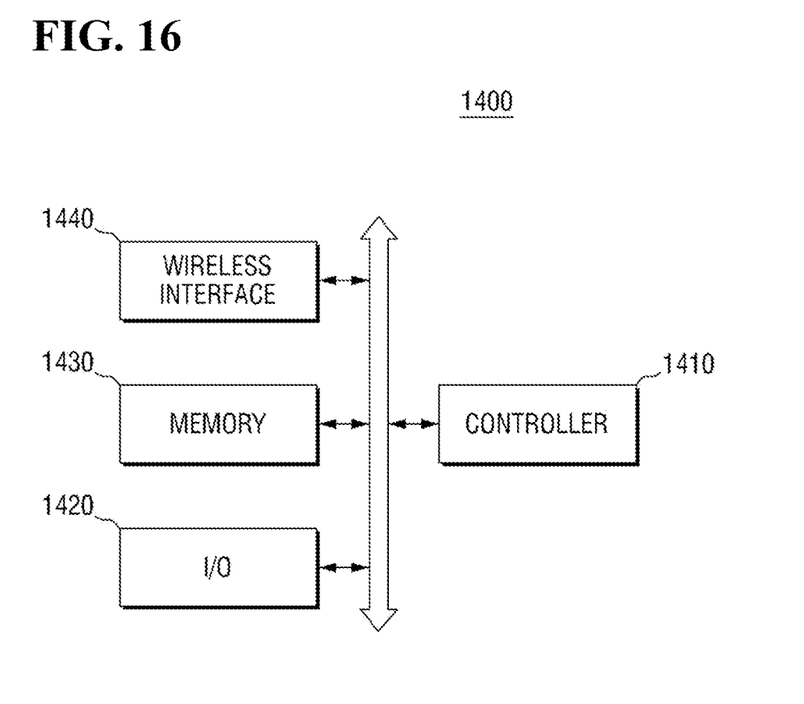
FIG. 16 is a block diagram of an electronic device including a semiconductor device fabricated according to any of the aforementioned method embodiments.

FIG. 16 is a block diagram of an embodiment of an electronic device 1400 including a semiconductor device fabricated according to one or more of the aforementioned embodiments. Referring to FIG. 16, the electronic device 1400 may include a semiconductor device fabricated according to various embodiments of the present invention. The electronic device 1400 can be used in wireless communication devices (such as a PDA, a notebook computer, a portable computer, a web tablet, a wireless phone, and/or a wireless digital music player) or various devices which exchange information in a wireless communication environment.

The electronic device 1400 may include a controller 1410, an input/output device 1420, a memory 1430, and a wireless interface 1440. The memory 1430 may include a semiconductor device fabricated according to one or more of the aforementioned embodiments.

The controller 1410 may include a microprocessor, a digital signal processor, or the like. The memory 1430 may be used to store commands (or user data) processed by the controller 1410. The wireless interface 1440 may be used to exchange data over a wireless data network. The wireless interface 1440 may include an antenna and/or a wireless transceiver. The electronic device 1400 may use a third-generation communication system protocol such as Code Division Multiple Access (CDMA), Global System for Mobile communication (GSM), North 20 American Digital Cellular (NADC), Enhanced-Time Division Multiple Access (E-TDMA), Wideband CDMA (WCDMA), or CDMA-2000.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of fabricating a semiconductor device comprising:
attaching a semiconductor substrate to a carrier using a carrier fixing layer, the semiconductor substrate including a plurality of first semiconductor chips;
forming gaps between adjacent ones of the plurality of first semiconductor chips;
filling the gaps with one or more chemicals to remove portions of the carrier fixing layer exposed in respective ones of the gaps; and
electrically connecting a plurality of second semiconductor chips to respective ones of the plurality of first semiconductor chips,
wherein the electrically connecting is performed between the attaching of the semiconductor substrate to the carrier and the forming of the gaps.

2. The method of claim 1, wherein the filling comprises:
filling the gaps with the one or more chemicals to remove the portions of the carrier fixing layer interposed between the plurality of first semiconductor chips and the carrier.

3. The method of claim 1, further comprising:
removing the one or more chemicals after the portions of the carrier fixing layer have been removed by the one or more chemicals.

4. The method of claim 1, wherein
each of the plurality of first semiconductor chips comprises a first surface and a second surface which are opposite each other,
said attaching the carrier includes attaching the carrier fixing layer to the first surface of each of the plurality of first semiconductor chips, the method further comprising:
attaching the second surface of each of the plurality of first semiconductor chips to an adhesive layer after the filling of the gaps with the one or more chemicals, and
separating the carrier from the plurality of first semiconductor chips after the attaching of the second surface to the adhesive layer.

5. The method of claim 1, wherein the filling comprises:
filling the gaps with the one or more chemicals for a time sufficient to allow each of the plurality of first semiconductor chips to be attached to the carrier by substantially a first width of the carrier fixing layer, the first width less than a second width of each of the plurality of first semiconductor chips.

6. The method of claim 1, wherein said filling the gaps includes:
filling the gaps with the one or more chemicals for a time sufficient to allow the portions of the carrier fixing layer to be removed under the plurality of first semiconductor chips.

7. The method of claim 1, further comprising:
forming a molding material to cover the semiconductor substrate and the second semiconductor chips before the forming of the gaps.

8. A method of fabricating a semiconductor device comprising:
attaching a semiconductor substrate to a carrier using a carrier fixing layer, the semiconductor substrate including a plurality of first semiconductor chips;
forming gaps by removing portions of the semiconductor substrate to expose the carrier fixing layer between adjacent ones of the plurality of first semiconductor chips; and
irradiating light to each of the gaps to remove portions of the carrier fixing layer corresponding to respective ones of the gaps,
wherein
each of the plurality of first semiconductor chips comprises a first surface opposing a second surface, and
the carrier is attached to the first surface of each of the plurality of first semiconductor chips by attaching the carrier fixing layer to the first surface of each of the plurality of first semiconductor chips.

9. The method of claim 8, wherein the light comprises laser light or ultraviolet light.

10. The method of claim 8, wherein said irradiating light comprises:
irradiating the light into the gaps through the carrier.

11. The method of claim 8, wherein said irradiating light comprises:

irradiating the light into the gaps from a source facing the second surfaces of the plurality of first semiconductor chips.

12. The method of claim 8, wherein said irradiating light comprises:
   irradiating the light into the gaps to remove the portions of the carrier fixing layer located between respective ones of the plurality of first semiconductor chips and the carrier.

13. A method of fabricating a semiconductor device comprising:
   attaching a semiconductor substrate to a carrier using a carrier fixing layer, the semiconductor substrate including a plurality of semiconductor chips;
   forming gaps between adjacent ones of the plurality of first semiconductor chips;
   forming first separation spaces in the carrier fixing layer corresponding to the gaps by irradiating laser light to the carrier fixing layer through the gaps; and
   forming second separation spaces in portions of the carrier fixing layer corresponding to the gaps, the forming the second separation spaces including removing portions of the carrier fixing layer interposed between the carrier and the plurality of first semiconductor chips by filling the gaps with one or more chemicals,
   wherein each of the first separation spaces is smaller than each of the second separation spaces.

14. The method of claim 13, wherein the forming the second separation spaces comprises increasing the width of the first separation spaces by filling the gaps and the first separation spaces with the one or more chemicals.

15. A method of fabricating a semiconductor device, the method comprising:
   attaching a semiconductor substrate to a carrier using a carrier fixing layer, the semiconductor substrate including a plurality of first semiconductor chips;
   forming gaps between adjacent ones of the plurality of first semiconductor chips; forming first separation spaces in the carrier fixing layer corresponding to the gaps by irradiating laser light to the carrier fixing layer through the gaps; and
   forming second separation spaces in portions of the carrier fixing layer corresponding to the gaps, the forming the second separation spaces including removing the portions of the carrier fixing layer interposed between the carrier and the plurality of first semiconductor chips,
   wherein each of the first separation spaces is smaller than each of the second separation spaces.

* * * * *